United States Patent
Yamashita et al.

(10) Patent No.: US 9,786,561 B2
(45) Date of Patent: Oct. 10, 2017

(54) WAFER PROCESSING METHOD (71) Applicant: DISCO CORPORATION, Tokyo (JP)

(72) Inventors: Yohei Yamashita, Tokyo (JP); Kenji Furuta, Tokyo (JP); Yihui Lee, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/962,843

(22) Filed: Dec. 8, 2015

(65) Prior Publication Data
US 2016/0163597 A1  Jun. 9, 2016

(30) Foreign Application Priority Data

Dec. 8, 2014 (JP) ................ 2014-248325

(51) Int. Cl.
H01L 21/00     (2006.01)
H01L 21/78     (2006.01)
H01L 21/304    (2006.01)
H01L 21/683    (2006.01)
H01L 23/544    (2006.01)

(52) U.S. Cl.
CPC .......... *H01L 21/78* (2013.01); *H01L 21/304* (2013.01); *H01L 21/6836* (2013.01); *H01L 23/544* (2013.01); *H01L 2221/6834* (2013.01); *H01L 2221/68327* (2013.01); *H01L 2223/54433* (2013.01); *H01L 2223/54486* (2013.01); *H01L 2924/0002* (2013.01)

(58) Field of Classification Search
CPC ... H01L 21/78; H01L 21/304; H01L 21/6836; H01L 23/544; H01L 2223/54486; H01L 2924/0002; H01L 2221/6834; H01L 2223/54433; H01L 2221/68327; H01L 21/3043
See application file for complete search history.

(56) References Cited

U.S. PATENT DOCUMENTS

| | | | |
|---|---|---|---|
| 2010/0193969 A1* | 8/2010 | Takamoto | H01L 21/6836 257/778 |
| 2014/0091458 A1* | 4/2014 | Van Gemert | H01L 21/561 257/737 |
| 2014/0099777 A1* | 4/2014 | Mackh | H01L 21/78 438/463 |

FOREIGN PATENT DOCUMENTS

| | | |
|---|---|---|
| JP | 10-305420 | 11/1998 |
| JP | 2002-192370 | 7/2002 |

* cited by examiner

*Primary Examiner* — Julio J Maldonado
*Assistant Examiner* — Stanetta Isaac
(74) *Attorney, Agent, or Firm* — Greer Burns & Crain, Ltd.

(57) ABSTRACT

A wafer processing method for dividing a wafer into individual device chips along division lines is disclosed. The wafer processing method includes a back grinding step of grinding the back side of the wafer in the condition where a protective tape is attached to the front side of the wafer, thereby reducing the thickness of the wafer to a predetermined thickness, and a reinforcing insulation seal mounting step of mounting a reinforcing insulation seal capable of transmitting infrared light on the back side of the wafer. The wafer processing method further includes a modified layer forming step of applying a laser beam along each division line to thereby form a modified layer inside the wafer along each division line and a wafer dividing step of applying an external force to the wafer to thereby divide the wafer into the individual device chips along each division line.

9 Claims, 11 Drawing Sheets

WAFER PROCESSING METHOD

BACKGROUND OF THE INVENTION

Field of the Invention

The present invention relates to a wafer processing method for dividing a wafer into a plurality of individual device chips along a plurality of division lines, the division lines being formed on the front side of the wafer to thereby define a plurality of separate regions where a plurality of devices corresponding to the device chips are formed.

Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are formed. These regions are divided from each other by cutting the semiconductor wafer along the division lines, thereby producing a plurality of individual device chips corresponding to the devices.

As a method of dividing the wafer along the division lines, a laser processing method has been tried. The laser processing method uses a pulsed laser beam having a transmission wavelength to the wafer, wherein the pulsed laser beam is applied to the wafer in the condition where the focal point of the pulsed laser beam is set inside the wafer in a subject area to be divided. That is, the wafer dividing method using this laser processing method includes the steps of applying a pulsed laser beam having a transmission wavelength to the wafer from one side of the wafer in the condition where the focal point of the pulsed laser beam is set inside the wafer, thereby continuously forming a modified layer inside the wafer along each division line, and next applying an external force to the wafer along each division line where the modified layer is formed to be reduced in strength, thereby breaking the wafer along each division line (see Japanese Patent No. 3408805, for example).

As another method of dividing the wafer along the division lines, there has been put into practical use a technique including the steps of applying a pulsed laser beam having an absorption wavelength to the wafer along each division line, thereby forming a laser processed groove along each division line by ablation, and next applying an external force to the wafer along each division line where the laser processed groove is formed as a break start point, thereby breaking the wafer along each division line (see Japanese Patent Laid-Open No. 1998-305420, for example).

SUMMARY OF THE INVENTION

In recent years, there has been proposed a technique of mounting a reinforcing insulation seal on the back side of a wafer for the purpose of reinforcing the individual device chips divided from each other. However, there is no established technique of efficiently dividing the wafer with the reinforcing insulation seal mounted on the back side to obtain the individual device chips.

It is therefore an object of the present invention to provide a wafer processing method which can efficiently divide the wafer with the reinforcing insulation seal mounted on the back side to obtain the individual device chips.

In accordance with an aspect of the present invention, there is provided a wafer processing method for dividing a wafer into a plurality of individual device chips along a plurality of division lines, the division lines being formed on a front side of the wafer to thereby define a plurality of separate regions where a plurality of devices corresponding to the device chips are formed, the wafer processing method including a back grinding step of grinding a back side of the wafer in a condition where a protective tape is attached to the front side of the wafer, thereby reducing a thickness of the wafer to a predetermined thickness; a reinforcing insulation seal mounting step of peeling the protective tape attached to the front side of the wafer and mounting a reinforcing insulation seal capable of transmitting infrared light on the back side of the wafer after performing the back grinding step; a reinforcing insulation seal hardening step of heating the reinforcing insulation seal mounted on the back side of the wafer to thereby harden the reinforcing insulation seal after performing the reinforcing insulation seal mounting step; a wafer supporting step of attaching a dicing tape to the reinforcing insulation seal mounted on the back side of the wafer and supporting a peripheral portion of the dicing tape to an annular frame after performing the reinforcing insulation seal hardening step; a modified layer forming step of setting a focal point of a laser beam inside the wafer in an area corresponding to each division line, the laser beam having an infrared wavelength transmissive to the wafer, and then applying the laser beam along each division line from the back side of the wafer through the dicing tape and the reinforcing insulation seal, thereby forming a modified layer inside the wafer along each division line after performing the wafer supporting step; and a wafer dividing step of applying an external force to the wafer to thereby divide the wafer into the individual device chips along each division line where the modified layer is formed, after performing the modified layer forming step.

Preferably, the wafer processing method further includes a marking step of applying a laser beam having an absorption wavelength to the reinforcing insulation seal, to a target area of the reinforcing insulation seal corresponding to each device, thereby marking device information in the target area corresponding to each device after performing the reinforcing insulation seal hardening step and before performing the wafer supporting step.

Preferably, the wafer processing method further includes a laser processed groove forming step of applying a laser beam having an absorption wavelength to the wafer from the front side of the wafer along each division line to thereby form a laser processed groove along each division line after performing the reinforcing insulation seal hardening step and before performing the modified layer forming step.

According to the wafer processing method of the present invention, the wafer with the reinforcing insulation seal mounted on the back side can be efficiently divided into the individual device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
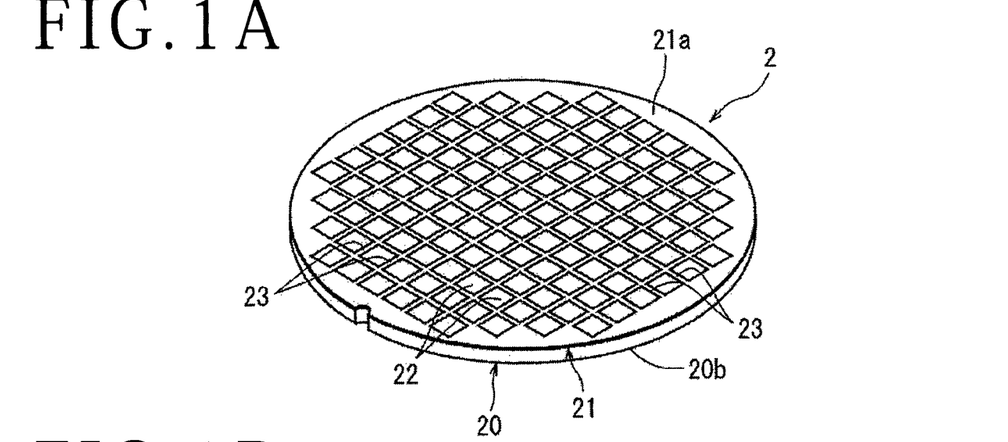
FIG. 1A is a perspective view of a semiconductor wafer.
Figure 1B:
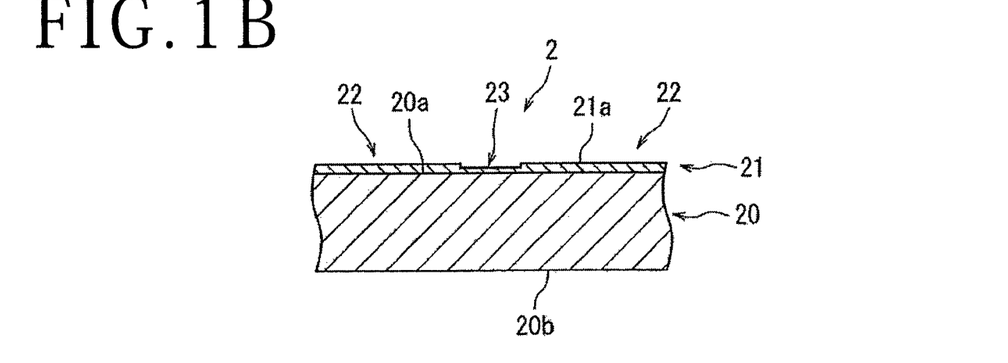
FIG. 1B is an enlarged sectional view of an essential part of the semiconductor wafer shown in FIG. 1A.

The wafer processing method according to the present invention will now be described in more detail with reference to the attached drawings. FIG. 1A is a perspective view of a semiconductor wafer to be divided into individual device chips by the wafer processing method according to the present invention, and FIG. 1B is an enlarged sectional view of an essential part of the semiconductor wafer shown in FIG. 1A. As shown in FIGS. 1A and 1B, a semiconductor wafer 2 is composed of a substrate 20 such as a silicon substrate and a functional layer 21 formed on a front side 20a of the substrate 20. For example, the substrate 20 has a thickness of 500 μm. The functional layer 21 is composed of an insulating film and a functional film formed on the insulating film, the functional film forming a plurality of circuits. A plurality of devices 22 such as ICs and LSIs are formed like matrix by the functional layer 21. That is, a plurality of crossing division lines 23 are formed on a front side 21a of the functional layer 21 to thereby define a plurality of separate regions where the plural devices 22 are formed. In this preferred embodiment, the insulating film constituting the functional layer 21 is provided by an $SiO_2$ film or a low-permittivity insulator film (low-k film). Examples of the low-k film include an inorganic film of SiOF, BSG (SiOB), etc. and an organic film such as a polymer film of polyimide, parylene, etc. For example, the thickness of the functional layer 21 is set to 10 μm.

Figure 2:
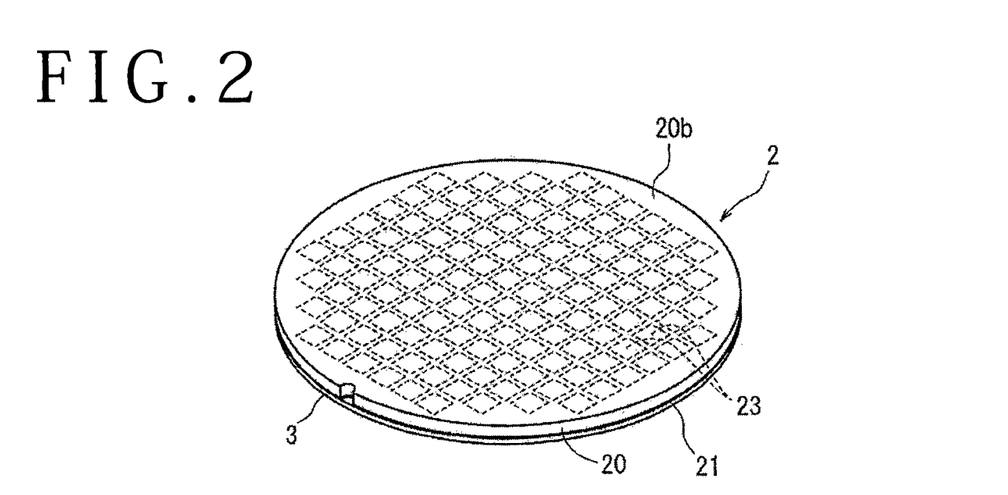
FIG. 2 is a perspective view of the semiconductor wafer in the condition where a protective tape is attached to the front side of the semiconductor wafer in a protective tape attaching step.

The wafer processing method for dividing the semiconductor wafer 2 along the division lines 23 will now be described. First, as shown in FIG. 2, a protective tape 3 is attached to the front side 21a of the functional layer 21 constituting the semiconductor wafer 2, so as to protect the devices 22 (protective tape attaching step). Accordingly, in the condition where the protective tape 3 is attached to the semiconductor wafer 2, a back side 20b of the substrate 20 is exposed. In this preferred embodiment, the protective tape 3 is composed of an acrylic resin base sheet and an acrylic resin adhesive layer formed on the front side of the acrylic resin base sheet. For example, the acrylic resin base sheet has a thickness of 100 μm, and the acrylic resin adhesive layer has a thickness of about 5 μm.

After performing the protective tape attaching step mentioned above, a back grinding step is performed in such a manner that the protective tape attached to the semiconductor wafer 2 is held on a holding surface of holding means included in a grinding apparatus and the back side of the semiconductor wafer 2 is then ground to reduce the thickness of the semiconductor wafer 2 to a predetermined thickness. This back grinding step is performed by using a grinding apparatus 4 shown in FIG. 3. The grinding apparatus 4 shown in FIG. 3 includes a chuck table 41 as workpiece holding means for holding a workpiece and grinding means 42 for grinding the workpiece held on the chuck table 41. The chuck table 41 has an upper surface as a holding surface for holding the workpiece under suction. The chuck table 41 is rotatable in the direction shown by an arrow 41a in FIG. 3 by a rotational drive mechanism (not shown). The grinding means 42 includes a spindle housing 421, a rotating spindle 422 rotatably supported to the spindle housing 421 and adapted to be rotated by a rotational drive mechanism (not shown), a mounter 423 fixed to the lower end of the rotating spindle 422, and a grinding wheel 424 mounted on the lower surface of the mounter 423. The grinding wheel 424 is composed of an annular base 425 and a plurality of abrasive members 426 fixed to the lower surface of the annular base 425 so as to be annularly arranged along the outer circumference thereof. The annular base 425 is mounted on the lower surface of the mounter 423 by a plurality of fastening bolts 427.

Figure 3:
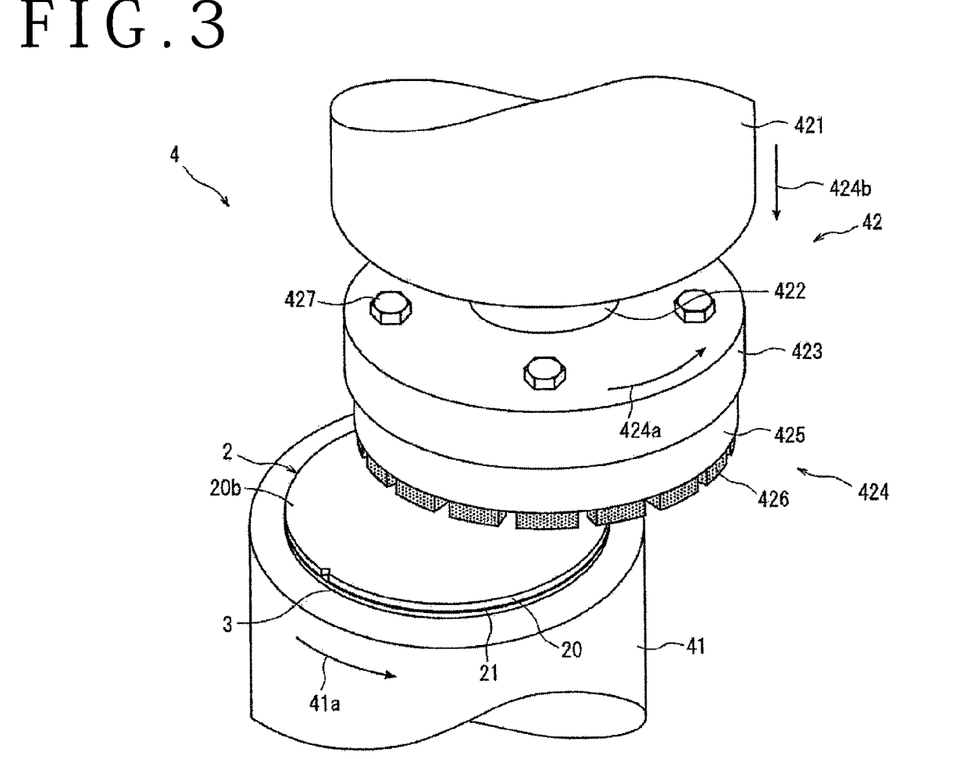
FIG. 3 is a perspective view of an essential part of a grinding apparatus for performing a back grinding step.
Figure 4:
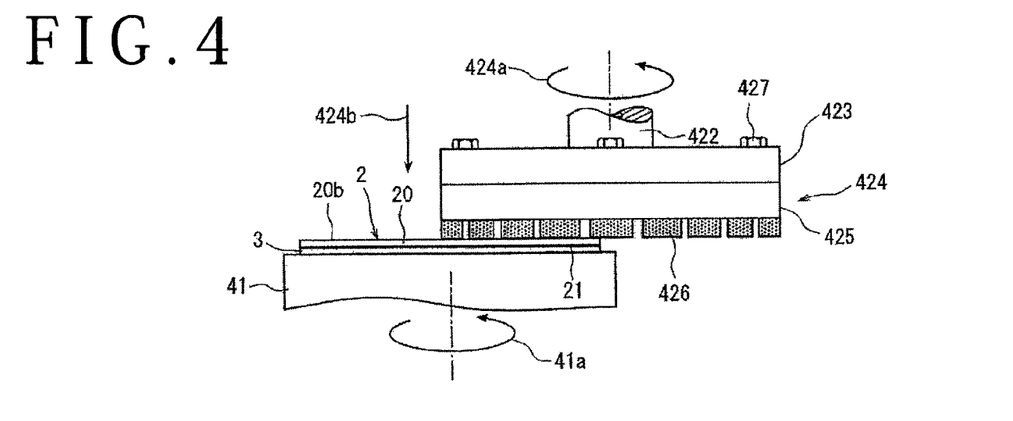
FIG. 4 is a side view for illustrating the back grinding step.

In performing the back grinding step by using the grinding apparatus 4 mentioned above, the semiconductor wafer 2 is placed on the chuck table 41 in the condition where the protective tape 3 attached to the semiconductor wafer 2 is in contact with the upper surface (holding surface) of the chuck table 41 as shown in FIG. 3. Thereafter, suction means (not shown) is operated to hold the semiconductor wafer 2 through the protective tape 3 on the chuck table 41 under suction (wafer holding step). Accordingly, the semiconductor wafer 2 is held through the protective tape 3 on the chuck table 41 under suction in the condition where the back side 20b of the substrate 20 is oriented upward. After holding the semiconductor wafer 2 through the protective tape 3 on the chuck table 41 under suction as mentioned above, the chuck table 41 is rotated in the direction of the arrow 41a in FIG. 3 at 300 rpm, for example. At the same time, the grinding wheel 424 of the grinding means 42 is also rotated in the direction shown by an arrow 424a in FIG. 3 at 6000 rpm, for example. Thereafter, the grinding wheel 424 is lowered to bring the abrasive members 426 of the grinding wheel 424 into contact with the back side 20b (work surface) of the substrate 20 of the semiconductor wafer 2. Thereafter, the grinding wheel 424 is fed (lowered) in the direction shown by an arrow 424b in FIGS. 3 and 4 (in the direction perpendicular to the holding surface of the chuck table 41) by a predetermined amount at a feed speed of 1 μm/second, for example. As a result, the back side 20b of the substrate 20 of the semiconductor wafer 2 is ground to reduce the thickness of the semiconductor wafer 2 to a predetermined thickness (e.g., 200 μm).

Figure 5A:
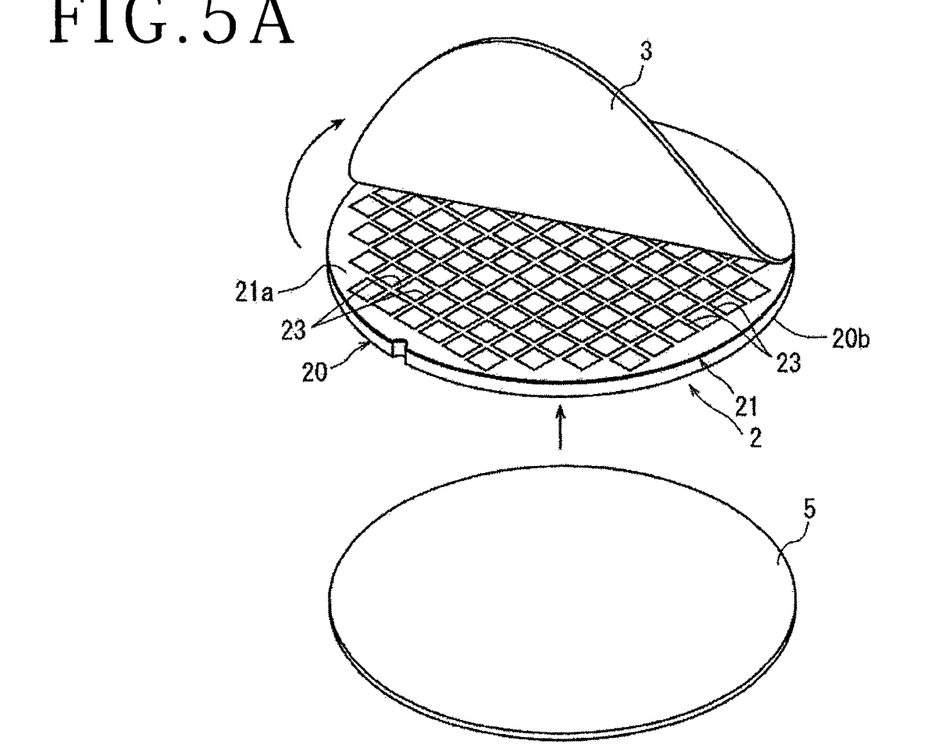
FIGS. 5A and 5B are perspective views for illustrating a reinforcing insulation seal mounting step.
Figure 5B:
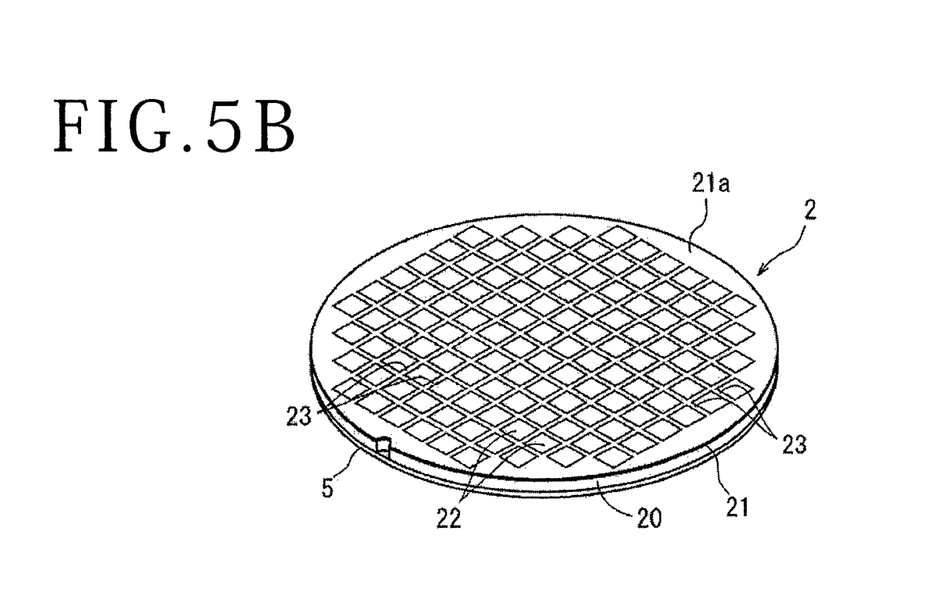

After performing the back grinding step mentioned above, a reinforcing insulation seal mounting step is performed in such a manner that the protective tape 3 attached to the front side of the wafer is peeled off and a reinforcing insulation seal capable of transmitting infrared light is mounted on the back side of the wafer. More specifically, as shown in FIGS. 5A and 5B, the protective tape 3 attached to the front side 21a of the functional layer 21 constituting the semiconductor wafer 2 is peeled off, and a reinforcing insulation seal 5 capable of transmitting infrared light is mounted on the back side 20b of the substrate 20 constituting the semiconductor wafer 2. Accordingly, as shown in FIG. 5B, the front side 21a of the functional layer 21 is exposed in the condition where the reinforcing insulation seal 5 is mounted on the back side 20b of the substrate 20. As the reinforcing insulation seal capable of transmitting infrared light, a reinforcing insulation seal manufactured and marketed by Lintec Corporation may be used.

Figure 6:
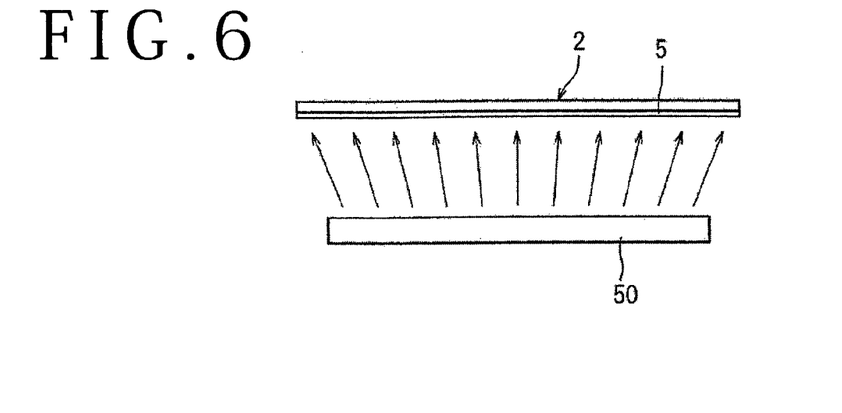
FIG. 6 is a side view for illustrating a reinforcing insulation seal hardening step.

After performing the reinforcing insulation seal mounting step mentioned above, a reinforcing insulation seal hardening step is performed in such a manner that the reinforcing insulation seal 5 mounted on the back side of the wafer is heated to be hardened. More specifically, as shown in FIG. 6, the reinforcing insulation seal 5 mounted on the back side 20b of the substrate 20 constituting the semiconductor wafer 2 is heated to be hardened by using a heater 50. For example, the reinforcing insulation seal 5 is heated at 130° C. for two hours in the reinforcing insulation seal hardening step.

Thereafter, a marking step is performed in such a manner that a laser beam having an absorption wavelength to the reinforcing insulation seal 5 is applied to the reinforcing insulation seal 5 in an area corresponding to each device, thereby marking device information in this area corresponding to each device. This marking step is performed by using a laser processing apparatus 6 shown in FIG. 7. The laser processing apparatus 6 shown in FIG. 7 includes a chuck table 61 for holding a workpiece, laser beam applying means 62 for applying a laser beam to the workpiece held on the chuck table 61, and imaging means 63 for imaging the workpiece held on the chuck table 61. The chuck table 61 has an upper surface as a holding surface for holding the workpiece under suction. The chuck table 61 is movable both in a feeding direction shown by an arrow X in FIG. 7 by feeding means (not shown) and in an indexing direction shown by an arrow Y in FIG. 7 by indexing means (not shown).

Figure 7:
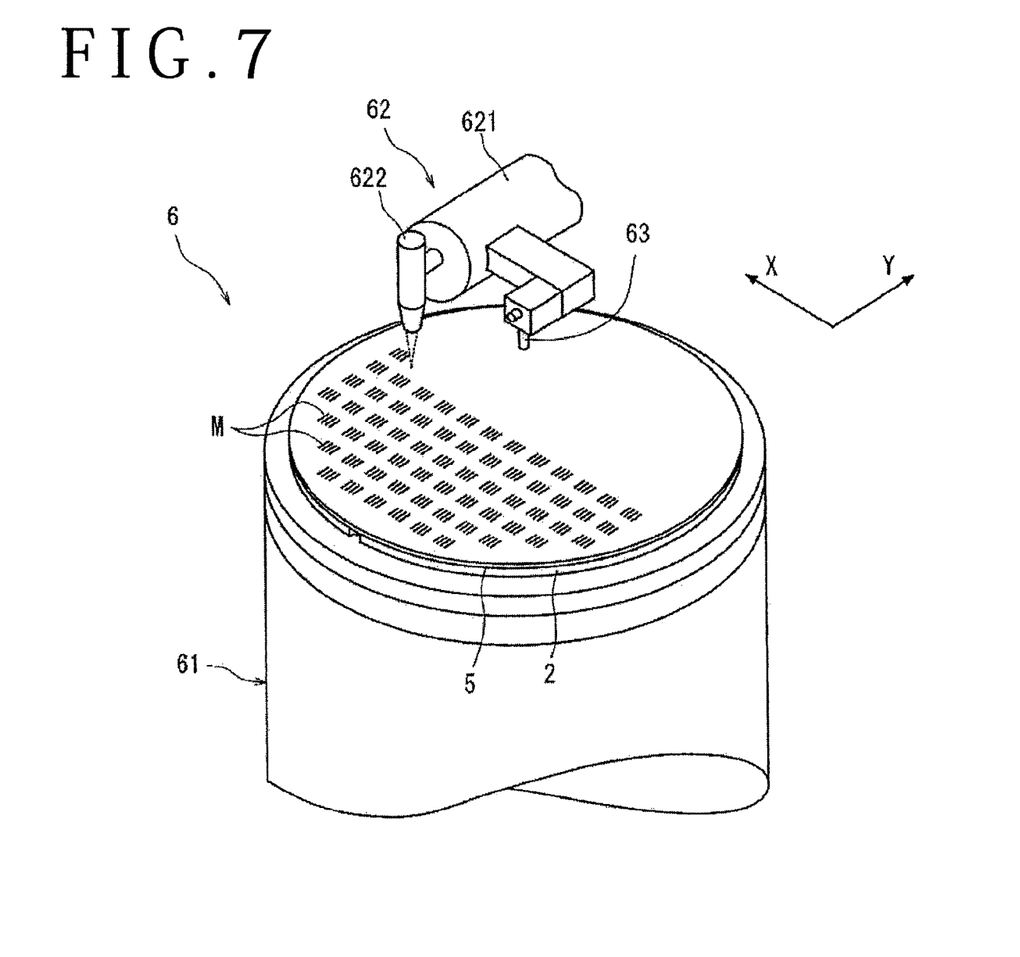
FIG. 7 is a perspective view for illustrating a marking step.

The laser beam applying means 62 includes a cylindrical casing 621 extending in a substantially horizontal direction. Although not shown, the casing 621 contains pulsed laser beam oscillating means including a pulsed laser beam oscillator and repetition frequency setting means. The laser beam applying means 62 further includes focusing means 622 mounted on the front end of the casing 621 for focusing a pulsed laser beam oscillated from the pulsed laser beam oscillating means. The laser beam applying means 62 further includes focal position adjusting means (not shown) for adjusting the focal position of the pulsed laser beam to be focused by the focusing means 622.

The imaging means 63 is mounted on the front end portion of the casing 621 of the laser beam applying means 62. The imaging means 63 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 63 is transmitted to control means (not shown).

In performing the marking step by using the laser processing apparatus 6 shown in FIG. 7, the semiconductor wafer 2 is first placed on the chuck table 61 of the laser processing apparatus 6 in the condition where the front side 21a of the functional layer 21 constituting the semiconductor wafer 2 is in contact with the upper surface of the chuck table 61. Thereafter, suction means (not shown) is operated to hold the semiconductor wafer 2 on the chuck table 61 under suction (wafer holding step). Accordingly, the semiconductor wafer 2 is held on the chuck table 61 in the condition where the reinforcing insulation seal 5 mounted on the back side 20b of the substrate 20 is oriented upward. After performing the wafer holding step, the chuck table 61 holding the semiconductor wafer 2 is moved to a position directly below the imaging means 63 by operating the feeding means (not shown). In the condition where the chuck table 61 is positioned directly below the imaging means 63, an alignment operation is performed by the imaging means 63 and the control means (not shown) to detect a target area of the semiconductor wafer 2 to be laser-processed. More specifically, the imaging means 63 and the control means perform image processing such as pattern matching for making the alignment between the target area of the reinforcing insulation seal 5 mounted on the back side 20b of the substrate 20, which target area corresponds to each device 22 formed in each of the separate regions defined by the plural division lines 23, and the focusing means 622 of the laser beam applying means 62 for applying the laser beam to this target area corresponding to each device 22, thus performing the alignment of a laser beam applying position on the reinforcing insulation seal 5 (alignment step).

Although the front side 21a of the functional layer 21 on which the division lines 23 are formed is oriented downward in this alignment operation, the division lines 23 can be imaged through the reinforcing insulation seal 5 and the substrate 20 from the back side of the wafer 2 because the imaging means 63 includes the infrared light applying means for applying infrared light to the wafer 2, the optical system for capturing the infrared light applied to the wafer 2, and the imaging device (infrared CCD) for outputting an electrical signal corresponding to the infrared light captured by the optical system as described above.

After performing this alignment step, the pulsed laser beam having an absorption wavelength to the reinforcing insulation seal 5 is applied from the focusing means 622 of the laser beam applying means 62 to the target area of the reinforcing insulation seal 5 corresponding to each device 22, thereby marking device information M in this target area as shown in FIG. 7.

For example, the marking step is performed under the following processing conditions.

Figure 8A:
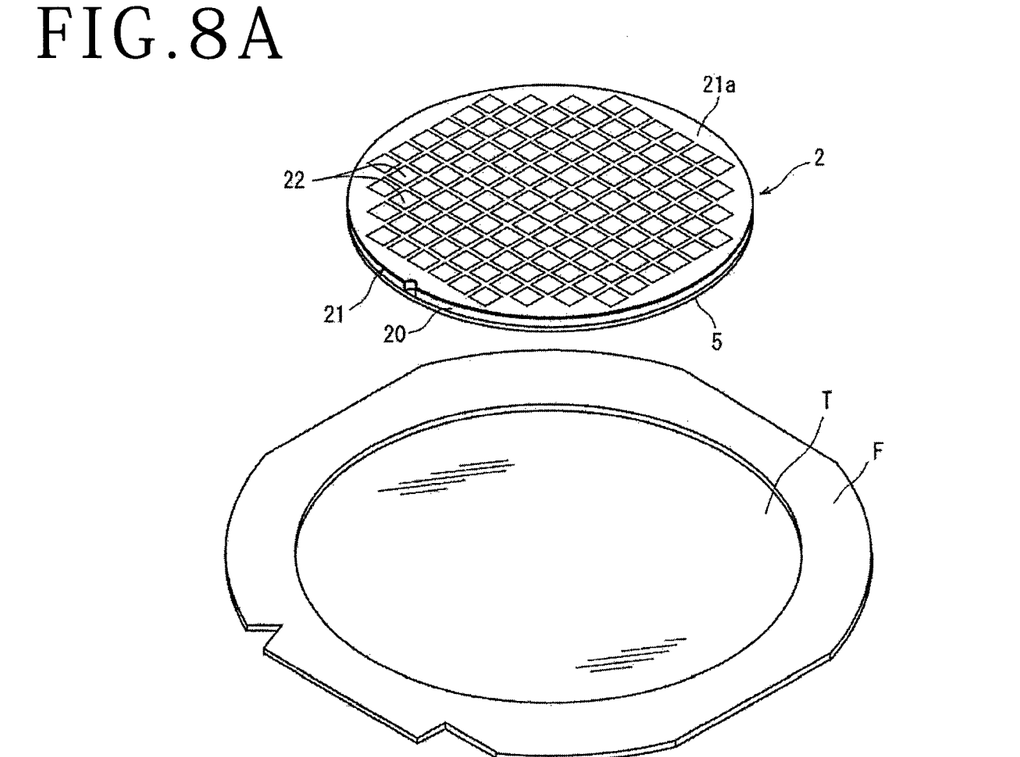
FIGS. 8A and 8B are perspective views for illustrating a wafer supporting step.
Figure 8B:
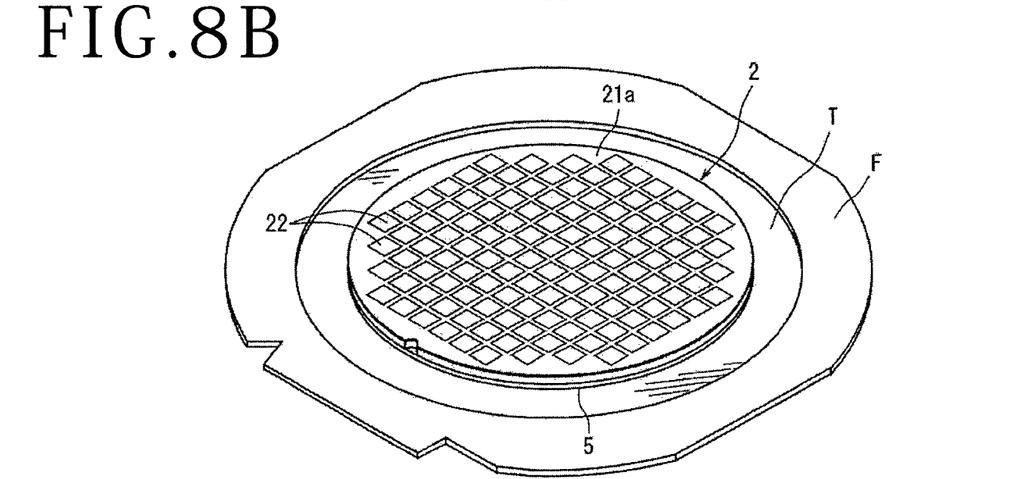

Wavelength of laser beam: 355 nm
Repetition frequency: 80 kHz
Power: 0.2 W
Focused spot diameter: 10 μm After performing the marking step mentioned above, a wafer supporting step is performed in such a manner that a dicing tape is attached to the reinforcing insulation seal mounted on the back side of the wafer and the peripheral portion of the dicing tape is supported to an annular frame. More specifically, as shown in FIGS. 8A and 8B, the reinforcing insulation seal 5 mounted on the back side 20b of the substrate 20 of the semiconductor wafer 2 is attached to a dicing tape T supported at its peripheral portion to an annular frame F. While the reinforcing insulation seal 5 mounted on the back side 20b of the substrate 20 of the semiconductor wafer 2 is attached to the dicing tape T supported at its peripheral portion to the annular frame F in this preferred embodiment, the dicing tape T may be attached to the reinforcing insulation seal 5 mounted on the back side 20b of the substrate 20 of the semiconductor wafer 2, and at the same time the peripheral portion of the dicing tape T may be supported to the annular frame F. The dicing tape T is composed of a synthetic resin sheet such as a polyvinyl chloride sheet and an adhesive layer formed on the front side of the synthetic resin sheet by applying a paste.

Thereafter, a laser processed groove forming step is performed in such a manner that a laser beam having an absorption wavelength to the wafer is applied to the wafer from the front side thereof along each division line to thereby form a laser processed groove along each division line. This laser processed groove forming step may be performed by using the laser processing apparatus 6 shown in FIG. 7. The laser processed groove forming step will now be described with reference to FIG. 9, in which the same laser processing apparatus 6 as that shown in FIG. 7 is shown. In performing the laser processed groove forming step by using the laser processing apparatus 6 shown in FIG. 9, the semiconductor wafer 2 is placed on the chuck table 61 of the laser processing apparatus 6 in the condition where the dicing tape T attached to the reinforcing insulation seal 5 mounted on the back side 20b of the substrate 20 is in contact with the upper surface of the chuck table 61. Thereafter, the suction means (not shown) is operated to hold the semiconductor wafer 2 through the dicing tape T and the reinforcing insulation seal 5 on the chuck table 61 under suction (wafer holding step). Accordingly, the front side 21a of the functional layer 21 of the semiconductor wafer 2 held on the chuck table 61 is oriented upward. Although the annular frame F supporting the dicing tape T is not shown in FIG. 9, the annular frame F is held by any suitable frame holding means provided on the chuck table 61. After performing this wafer holding step, the chuck table 61 holding the semiconductor wafer 2 is moved to a position directly below the imaging means 63 by operating the feeding means (not shown).

Figure 9:
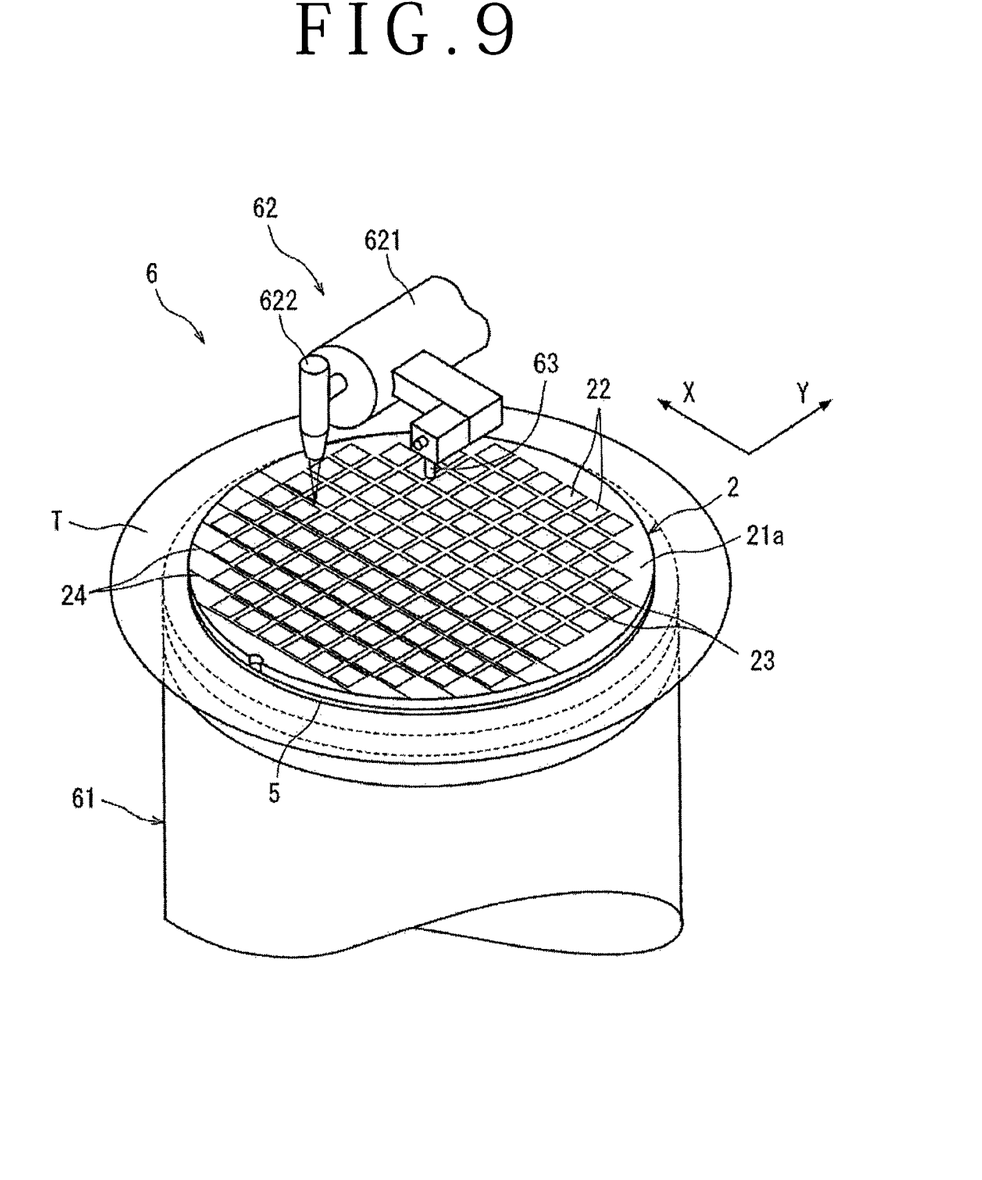
FIG. 9 is a perspective view of an essential part of a laser processing apparatus for performing a laser processed groove forming step.

In the condition where the chuck table 61 is positioned directly below the imaging means 63, an alignment operation is performed by the imaging means 63 and the control means (not shown) to detect a subject area of the semiconductor wafer 2 to be laser-processed. More specifically, the imaging means 63 and the control means perform image processing such as pattern matching for making the alignment between the division lines 23 extending in a first direction on the front side 21a of the functional layer 21 of the semiconductor wafer 2 and the focusing means 622 of the laser beam applying means 62 for applying the laser beam to the wafer 2 along the division lines 23, thus performing the alignment of a laser beam applying position (alignment step). Similarly, this alignment step is performed for the other division lines 23 extending in a second direction perpendicular to the first direction on the front side 21a of the functional layer 21 of the semiconductor wafer 2.

Figure 10A:
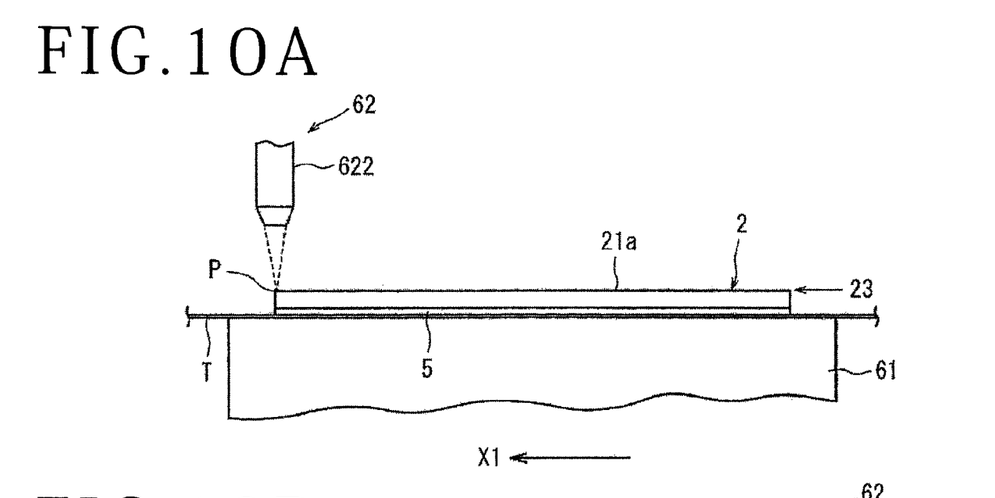
FIGS. 10A to 10C are sectional side views for illustrating the laser processed groove forming step.
Figure 10B:
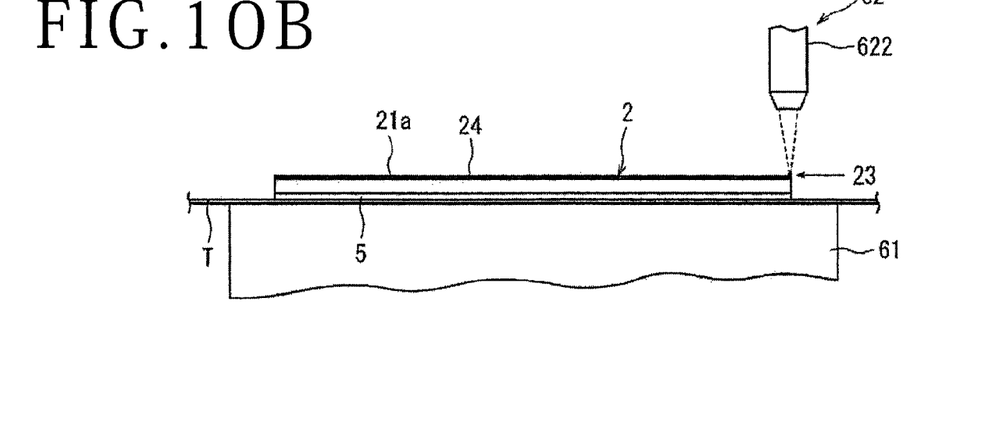
Figure 10C:
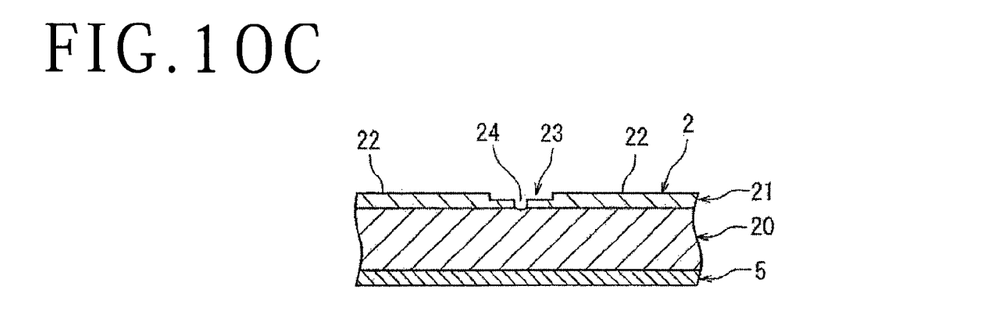

After performing the alignment step mentioned above, the chuck table 61 is moved to a laser beam applying area where the focusing means 622 of the laser beam applying means 62 is located as shown in FIG. 10A, thereby positioning one end (left end as viewed in FIG. 10A) of a predetermined one of the division lines 23 extending in the first direction directly below the focusing means 622. Further, the focal point P of the pulsed laser beam to be applied from the focusing means 622 is set near the upper surface of the predetermined division line 23. Thereafter, the pulsed laser beam is applied from the focusing means 622 to the semiconductor wafer 2, and the chuck table 61 is moved at a predetermined feed speed in the direction shown by an arrow X1 in FIG. 10A. When the other end (right end as viewed in FIG. 10B) of the predetermined division line 23 reaches the position directly below the focusing means 622 as shown in FIG. 10B, the application of the pulsed laser beam is stopped and the movement of the chuck table 61 is also stopped. As a result, a laser processed groove 24 having a depth greater than the thickness of the functional layer 21, i.e., reaching the substrate 20 is formed along the predetermined division line 23 on the front side of the semiconductor wafer 2 as shown in FIG. 10C, so that the functional layer 21 is divided by the laser processed groove 24. The laser processed groove forming step mentioned above is similarly performed along all of the other division lines 23 formed on the front side of the semiconductor wafer 2.

For example, the laser processed groove forming step mentioned above is performed under the following processing conditions.

Wavelength of laser beam: 355 nm
Average power: 2 W
Repetition frequency: 200 kHz
Focused spot diameter: 6 μm
Work feed speed: 500 mm/second After performing the laser processed groove forming step mentioned above, a modified layer forming step is performed in such a manner that the focal point of a laser beam having an infrared region transmissive to the wafer is set inside the substrate in an area corresponding to each division line, and the laser beam is applied along each division line from the back side of the wafer (from the dicing tape side) through the reinforcing insulation seal, thereby forming a modified layer inside the wafer along each division line. This modified layer forming step is performed by using a laser processing apparatus 60 shown in FIG. 11, which is similar to the laser processing apparatus 6 shown in FIGS. 7 and 9. Accordingly, substantially the same components of the laser processing apparatus 60 shown in FIG. 11 as those of the laser processing apparatus 6 shown in FIGS. 7 and 9 are denoted by the same reference numerals and the description thereof will be omitted.

Figure 11:
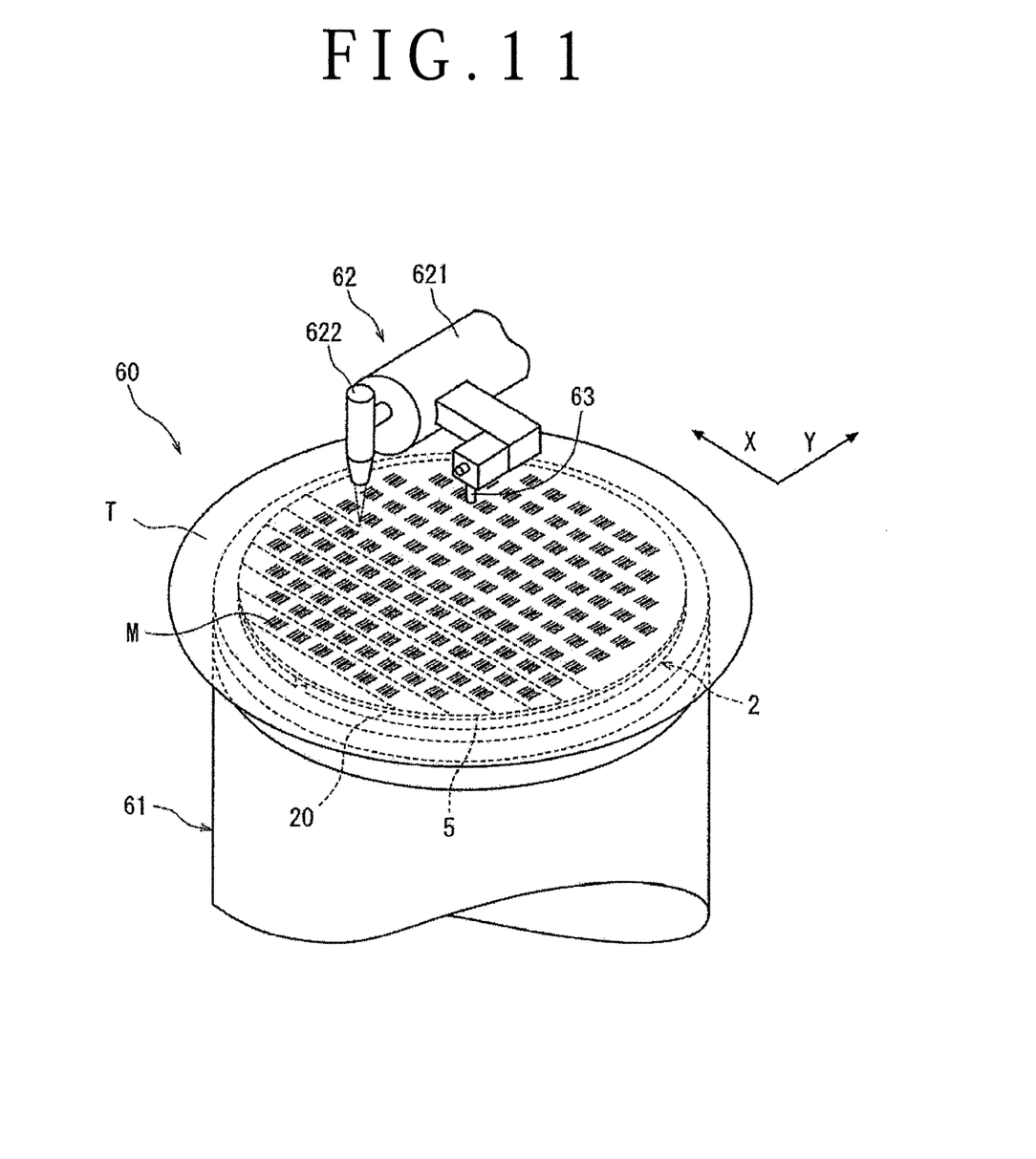
FIG. 11 is a perspective view of an essential part of a laser processing apparatus for performing a modified layer forming step.

In performing the modified layer forming step by using the laser processing apparatus 60 shown in FIG. 11, the semiconductor wafer 2 is placed on the chuck table 61 of the laser processing apparatus 60 in the condition where the front side 21a of the functional layer 21 of the semiconductor wafer 2 is in contact with the upper surface of the chuck table 61. Thereafter, the suction means (not shown) is operated to hold the semiconductor wafer 2 on the chuck table 61 under suction (wafer holding step). Accordingly, the semiconductor wafer 2 is held on the chuck table 61 in the condition where the dicing tape T attached to the reinforcing insulation seal 5 mounted on the back side 20b of the substrate 20 is oriented upward. Although the annular frame F supporting the dicing tape T is not shown in FIG. 11, the annular frame F is held by any suitable frame holding means provided on the chuck table 61. After performing the wafer holding step, the chuck table 61 holding the semiconductor wafer 2 is moved to a position directly below the imaging means 63 by operating the feeding means (not shown).

In the condition where the chuck table 61 is positioned directly below the imaging means 63, an alignment operation is performed by the imaging means 63 and the control means (not shown) to detect a subject area of the semiconductor wafer 2 to be laser-processed. This alignment operation is substantially similar to the alignment operation in the laser processed groove forming step mentioned above. Although the front side 21a of the functional layer 21 on which the division lines 23 are formed is oriented downward in the alignment operation, the division lines 23 can be imaged through the dicing tape T, the reinforcing insulation seal 5, and the substrate 20 from the back side of the wafer 2 because the imaging means 63 includes the infrared light applying means for applying infrared light to the wafer 2, the optical system for capturing the infrared light applied to the wafer 2, and the imaging device (infrared CCD) for outputting an electrical signal corresponding to the infrared light captured by the optical system as described above.

Figure 12A:
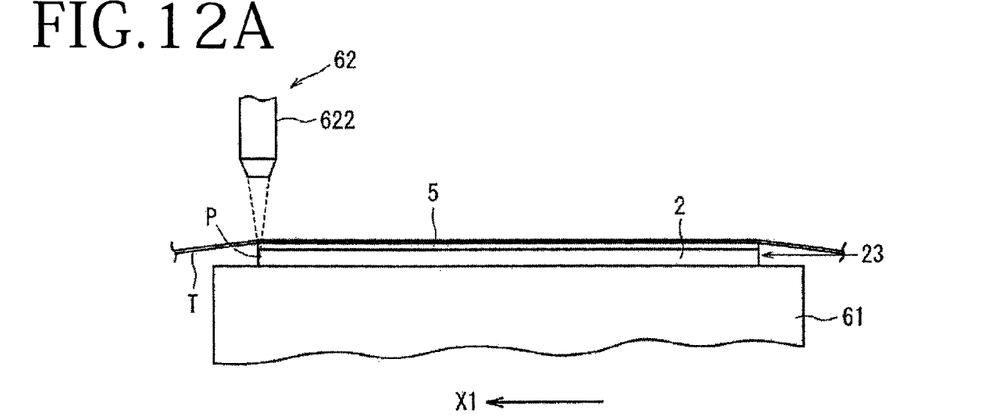
FIGS. 12A to 12C are sectional side views for illustrating the modified layer forming step.
Figure 12B:
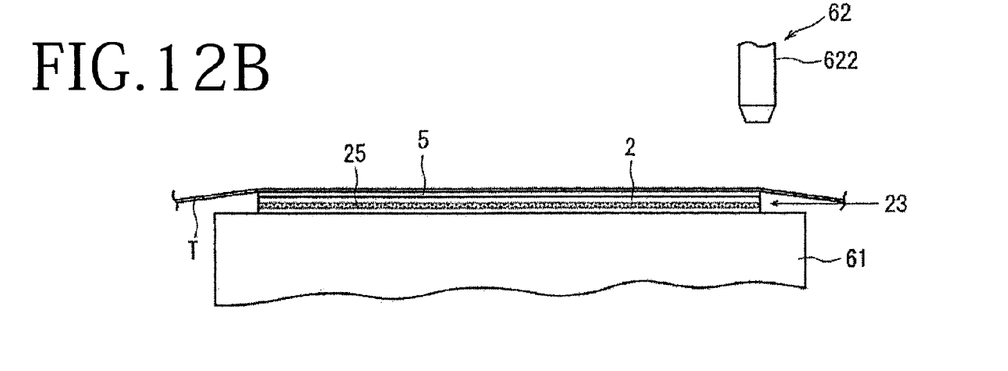
Figure 12C:
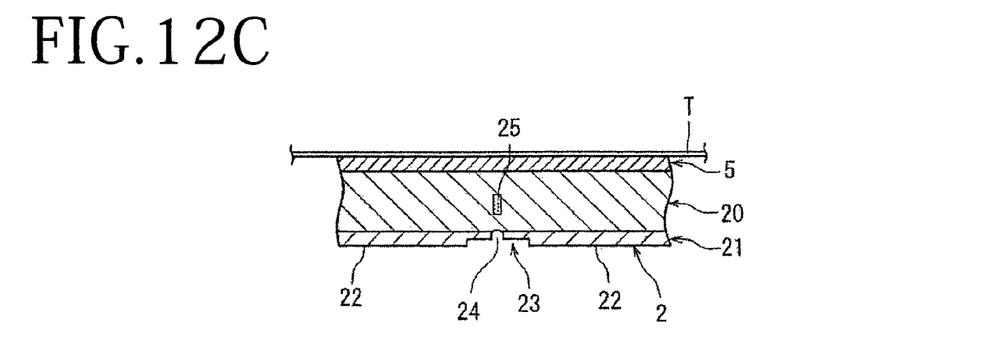

After performing this alignment step, the chuck table 61 is moved to a laser beam applying area where the focusing means 622 of the laser beam applying means 62 is located as shown in FIG. 12A, thereby positioning one end (left end as viewed in FIG. 12A) of a predetermined one of the division lines 23 extending in the first direction directly below the focusing means 622. Further, the focal point P of the pulsed laser beam to be applied from the focusing means 622 is set inside the substrate 20 in an area corresponding to the predetermined division line 23, wherein the pulsed laser beam has an infrared region transmissive to the substrate 20. Thereafter, the pulsed laser beam is applied from the focusing means 622 to the semiconductor wafer 2, and the chuck table 61 is moved at a predetermined feed speed in the direction shown by an arrow X1 in FIG. 12A. When the other end (right end as viewed in FIG. 12B) of the predetermined division line 23 reaches the position directly below the focusing means 622 as shown in FIG. 12B, the application of the pulsed laser beam is stopped and the movement of the chuck table 61 is also stopped. As a result, a modified layer 25 is formed inside the substrate 20 of the semiconductor wafer 2 along the predetermined division line 23 as shown in FIGS. 12B and 12C. The modified layer forming step mentioned above is similarly performed along all of the other division lines 23 formed on the front side of the semiconductor wafer 2.

For example, the modified layer forming step is performed under the following processing conditions.

Figure 13:
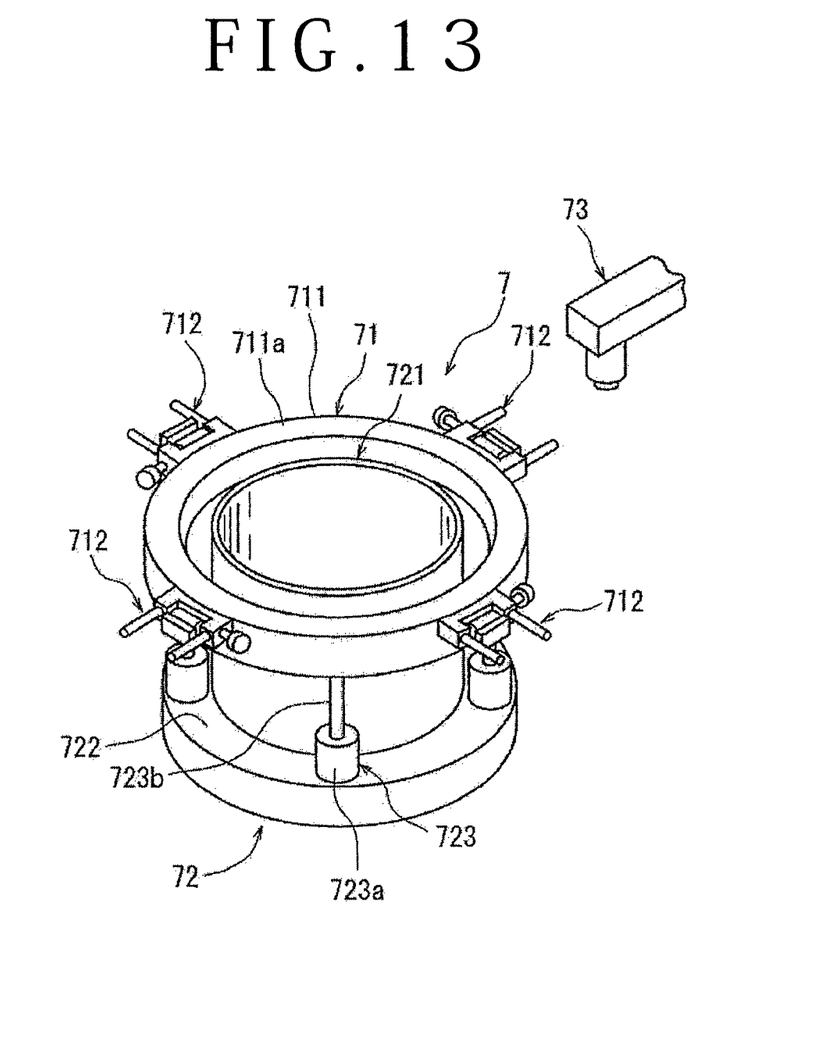
FIG. 13 is a perspective view of a tape expanding apparatus for performing a wafer dividing step.

Light source: LD pumped Q-switched Nd
: YVO4 pulsed laser
Wavelength: 1064 nm
Power: 0.5 W
Repetition frequency: 100 kHz
Focused spot diameter: 1 μm
Work feed speed: 200 mm/second After performing the modified layer forming step mentioned above, a wafer dividing step is performed in such a manner that an external force is applied to the wafer to thereby divide the wafer into the individual devices (device chips) along each division line where the modified layer is formed. This wafer dividing step is performed by using a tape expanding apparatus 7 shown in FIG. 13. The tape expanding apparatus 7 shown in FIG. 13 includes frame holding means 71 for holding the annular frame F, tape expanding means 72 for expanding the dicing tape T supported to the annular frame F held by the frame holding means 71, and a pickup collet 73. The frame holding means 71 includes an annular frame holding member 711 and a plurality of clamps 712 as fixing means provided on the outer circumference of the frame holding member 711. The upper surface of the frame holding member 711 functions as a mounting surface 711a for mounting the annular frame F thereon. The annular frame F mounted on the mounting surface 711a is fixed to the frame holding member 711 by the clamps 712. The frame holding means 71 is supported by the tape expanding means 72 so as to be vertically movable.

Figure 14A:
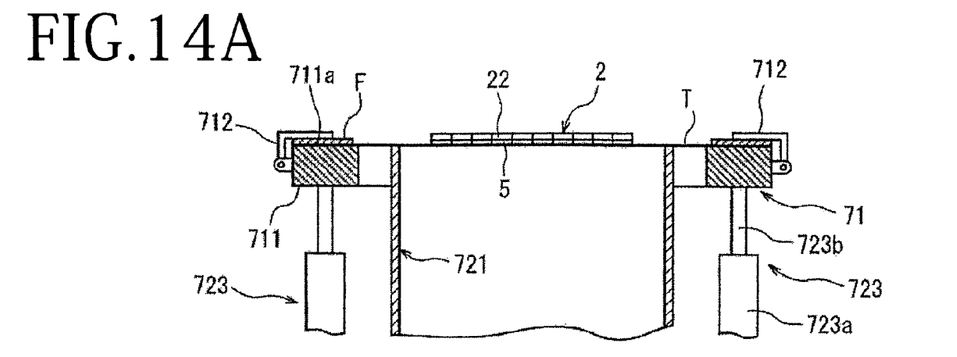
FIGS. 14A to 14C are sectional side views for illustrating the wafer dividing step.
Figure 14B:
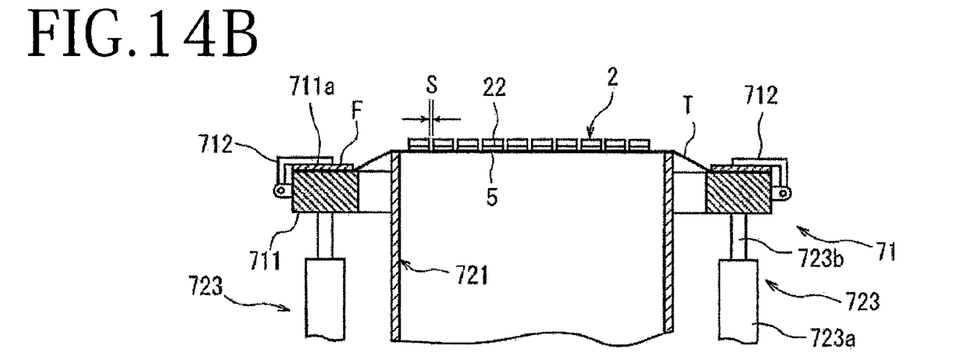

The tape expanding means 72 includes an expanding drum 721 provided inside of the annular frame holding member 711. The expanding drum 721 has an outer diameter smaller than the inner diameter of the annular frame F and an inner diameter larger than the outer diameter of the semiconductor wafer 2 attached to the dicing tape T supported to the annular frame F. The expanding drum 721 has a supporting flange 722 at the lower end of the expanding drum 721. The tape expanding means 72 further includes supporting means 723 for vertically movably supporting the annular frame holding member 711. The supporting means 723 is composed of a plurality of air cylinders 723a provided on the supporting flange 722. Each air cylinder 723a is provided with a piston rod 723b connected to the lower surface of the annular frame holding member 711. The supporting means 723 composed of these plural air cylinders 723a functions to vertically move the annular frame holding member 711 so as to selectively take a reference position where the mounting surface 711a is substantially equal in height to the upper end of the expanding drum 721 as shown in FIG. 14A and an expansion position where the mounting surface 711a is lower in height than the upper end of the expanding drum 721 by a predetermined amount as shown in FIG. 14B.

The wafer dividing step using the tape expanding apparatus 7 will now be described with reference to FIGS. 14A to 14C. As shown in FIG. 14A, the annular frame F supporting the semiconductor wafer 2 through the dicing tape T is mounted on the mounting surface 711a of the frame holding member 711 of the frame holding means 71 and fixed to the frame holding member 711 by the clamps 712 (frame holding step). At this time, the frame holding member 711 is set at the reference position shown in FIG. 14A. Thereafter, the air cylinders 723a as the supporting means 723 of the tape expanding means 72 are operated to lower the frame holding member 711 to the expansion position shown in FIG. 14B. Accordingly, the annular frame F fixed to the mounting surface 711a of the frame holding member 711 is also lowered, so that the dicing tape T supported to the annular frame F comes into abutment against the upper end of the expanding drum 721 and is expanded as shown in FIG. 14B (tape expanding step). As a result, a tensile force acts on the semiconductor wafer 2 attached to the dicing tape T in the radial direction of the semiconductor wafer 2, so that the semiconductor wafer 2 is divided along each division line 23 where the modified layer 25 is formed to have a reduced strength. Further, the functional layer 21 of the semiconductor wafer 2 has already been divided by the laser processed groove 24 formed along each division line 23 in the laser processed groove forming step, so that the semiconductor wafer 2 can be reliably divided into the individual devices 22 along each division line 23, and a spacing S is formed between any adjacent ones of the individual devices 22 as shown in FIG. 14B.

Figure 14C:
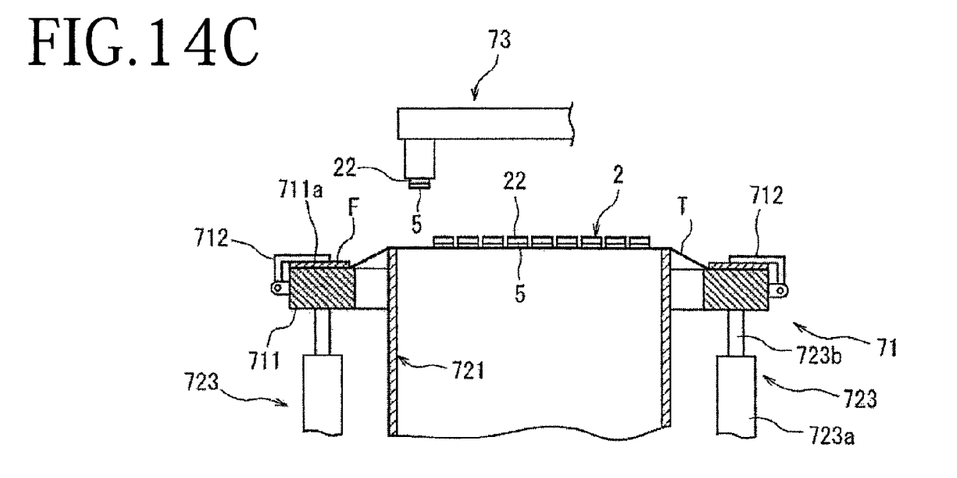

Thereafter, the pickup collet 73 is operated to hold each device 22 under suction and peel it from the dicing tape T together with the reinforcing insulation seal 5 mounted on the back side of each device 22, thus individually picking up the devices 22 with the reinforcing insulation seals 5 as shown in FIG. 14C (pickup step). Thereafter, each device 22 thus picked up is transferred to a tray (not shown) or a position where a die bonding step is performed. As described above, the spacing S is formed between any adjacent ones of the individual devices 22 attached to the dicing tape T as shown in FIG. 14B, so that each device 22 can be easily picked up without the contact with its adjacent device 22 in the pickup step shown in FIG. 14C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of division lines, said division lines being formed on a front side of said wafer to thereby define a plurality of separate regions where a plurality of devices corresponding to said device chips are formed, said wafer processing method comprising:
   a back grinding step of grinding a back side of said wafer in a condition where a protective tape is attached to the front side of said wafer, thereby reducing a thickness of said wafer to a predetermined thickness;
   a reinforcing insulation seal mounting step of peeling said protective tape attached to the front side of said wafer and mounting a reinforcing insulation seal capable of transmitting infrared light on the back side of said wafer after performing said back grinding step;
   a reinforcing insulation seal hardening step of heating said reinforcing insulation seal mounted on the back side of said wafer to thereby harden said reinforcing insulation seal after performing said reinforcing insulation seal mounting step;
   a wafer supporting step of attaching a dicing tape to said reinforcing insulation seal mounted on the back side of said wafer and supporting a peripheral portion of said dicing tape to an annular frame after performing said reinforcing insulation seal hardening step;
   a modified layer forming step of setting a focal point of a laser beam inside said wafer in an area corresponding to each division line, said laser beam having an infrared wavelength transmissive to said wafer, and then applying said laser beam along each division line from the back side of said wafer through said dicing tape and said reinforcing insulation seal, thereby forming a modified layer inside said wafer along each division line after performing said wafer supporting step; and
   a wafer dividing step of applying an external force to said wafer to thereby divide said wafer into said individual device chips along each division line where said modified layer is formed, after performing said modified layer forming step.

2. The wafer processing method according to claim 1, further comprising:
   a laser processed groove forming step of applying a laser beam having an absorption wavelength to said wafer from the front side of said wafer along each division line to thereby form a laser processed groove along each division line after performing said reinforcing insulation seal hardening step and before performing said modified layer forming step.

3. The wafer processing method according to claim 1, wherein the reinforcing insulation seal is mounted to the devices and the division lines during the reinforcing insulation seal mounting step.

4. The wafer processing method according to claim 1, further comprising:
   a marking step of applying a laser beam having an absorption wavelength to said reinforcing insulation seal, to a target area of said reinforcing insulation seal corresponding to each device, thereby marking device information in said target area corresponding to each device.

5. The wafer processing method according to claim 1, wherein said mounting of the reinforcing insulation seal on the back side of the wafer of the reinforcing insulation seal mounting step is performed before said attaching the dicing tape to said reinforcing insulation seal of the wafer supporting step.

6. A wafer processing method for dividing a wafer into a plurality of individual device chips along a plurality of division lines, said division lines being formed on a front side of said wafer to thereby define a plurality of separate regions where a plurality of devices corresponding to said device chips are formed, said water processing method comprising:
   a back grinding step of grinding a back side of said wafer in a condition where a protective tape is attached to the front side of said water, thereby reducing a thickness of said wafer to a predetermined thickness;
   a reinforcing insulation seal mounting step of peeling said protective tape attached to the front side of said wafer and mounting a reinforcing insulation seal capable of transmitting infrared light on the back side of said wafer after performing said hack grinding step;
   a reinforcing insulation seal hardening step of heating said reinforcing insulation seal mounted on the back side of said wafer to thereby harden said reinforcing insulation seal after performing said reinforcing insulation seal mounting step;
   a wafer supporting step of attaching a dicing tape to said reinforcing insulation seal mounted on the back side of said wafer and supporting a peripheral portion of said dicing tape to an annular frame after performing said reinforcing insulation seal hardening step;
   a modified layer forming step of setting a focal point of a laser beam inside said wafer in an area corresponding to each division line, said laser beam having an infrared wavelength transmissive to said wafer and then applying said laser beam along each division line from the back side of said wafer through said dicing tape and said reinforcing insulation seal, thereby forming a modified layer inside said wafer along each division line after performing said wafer supporting step; and
   a wafer dividing step of applying an external force to said wafer to thereby divide said wafer into said individual device chips along each division line where said modified layer is formed, after performing said modified layer forming step; and
   wherein the wafer processing method further comprises:
      a marking step of applying a laser beam having an absorption wavelength to said reinforcing insulation seal, to a target area of said reinforcing insulation seal corresponding to each device, thereby marking device information in said target area corresponding to each device after performing said reinforcing insulation seal hardening step and before performing said wafer supporting step.

7. The wafer processing method according to claim 6, further comprising:
   a laser processed groove forming step of applying a laser beam having an absorption wavelength to said wafer from the front side of said wafer along each division line to thereby form a laser processed groove along each division line after performing said reinforcing insulation seal hardening step and before performing said modified layer forming step.

8. The wafer processing method according to claim 6, wherein the reinforcing insulation seal is mounted to the devices and the division lines during the reinforcing insulation seal mounting step.

9. The wafer processing method according to claim 6, wherein said mounting of the reinforcing insulation seal on the back side of the wafer of the reinforcing insulation seal mounting step is performed before said attaching the dicing tape to said reinforcing insulation seal of the wafer supporting step.

* * * * *

UNITED STATES PATENT AND TRADEMARK OFFICE
CERTIFICATE OF CORRECTION

PATENT NO. : 9,786,561 B2
APPLICATION NO. : 14/962843
DATED : October 10, 2017
INVENTOR(S) : Yohei Yamashita, Kenji Furuta and Yihui Lee It is certified that error appears in the above-identified patent and that said Letters Patent is hereby corrected as shown below:

In the Claims

Column 12, Line 19, delete "hack" and insert -- back --.

Signed and Sealed this
Seventeenth Day of April, 2018

Andrei Iancu
*Director of the United States Patent and Trademark Office*